United States Patent
Fujio et al.

(10) Patent No.: US 10,153,405 B2
(45) Date of Patent: Dec. 11, 2018

(54) FLUORESCENT MATERIAL, LIGHT EMITTING DEVICE, AND METHOD FOR PRODUCING FLUORESCENT MATERIAL

(71) Applicant: NICHIA CORPORATION, Anan-shi, Tokushima (JP)

(72) Inventors: Kazushige Fujio, Tokushima (JP); Masaki Kondo, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/440,719

(22) Filed: Feb. 23, 2017

(65) Prior Publication Data
US 2017/0250321 A1    Aug. 31, 2017

(30) Foreign Application Priority Data

Feb. 26, 2016 (JP) .................................. 2016-036395
Feb. 6, 2017 (JP) .................................. 2017-019626

(51) Int. Cl.
| H01L 33/50 | (2010.01) |
| C09K 11/02 | (2006.01) |
| C09K 11/77 | (2006.01) |

(52) U.S. Cl.
CPC .......... *H01L 33/502* (2013.01); *C09K 11/025* (2013.01); *C09K 11/7734* (2013.01);
(Continued)

(58) Field of Classification Search
CPC ... C09K 11/7734; C09K 11/55; C09K 11/643; H01L 33/502; H01L 2933/0041
See application file for complete search history.

(56) References Cited

U.S. PATENT DOCUMENTS

| 2002/0063301 A1 | 5/2002 | Hanamoto et al. |
| 2006/0027781 A1* | 2/2006 | Dong ................... C09K 11/592 |
| | | 252/62.52 |

(Continued)

FOREIGN PATENT DOCUMENTS

| EP | 0333053 A2 | 9/1989 |
| JP | H01-315485 A | 12/1989 |

(Continued)

*Primary Examiner* — David Spalla
(74) *Attorney, Agent, or Firm* — Hunton Andrews Kurth LLP

(57) ABSTRACT

A method for producing a fluorescent material is provided. The method includes preparing fluorescent material particles that contain an alkaline earth metal aluminate having a composition represented by $(Sr_{1-x},Eu_x)_4Al_{14}O_{25}$, where x satisfies $0.05 \leq x \leq 0.4$, and a part of Sr may be substituted by at least one element selected from the group consisting of Mg, Ca, Ba, and Zn; causing the prepared fluorescent material particles to come into contact with a liquid medium containing water; removing at least a portion of the contacted liquid medium to obtain purified fluorescent material particles; causing a phosphate compound to adhere to surfaces of the purified fluorescent material particles to obtain fluorescent material particles to which the phosphate compound is adhered; and heat treating the fluorescent material particles to which the phosphate compound is adhered at 500° C. to 700° C.

11 Claims, 6 Drawing Sheets

(52) U.S. Cl.
CPC .. *H01L 33/501* (2013.01); *H01L 2224/48091* (2013.01); *H01L 2224/48247* (2013.01); *H01L 2224/48257* (2013.01); *H01L 2224/73265* (2013.01); *H01L 2924/181* (2013.01)

(56) References Cited

U.S. PATENT DOCUMENTS

2015/0137037 A1   5/2015   Takeda et al.
2017/0002264 A1   1/2017   Kawataki et al.

FOREIGN PATENT DOCUMENTS

| JP | H08-319483 A  | 12/1996 |
| JP | H10-273654 A  | 10/1998 |
| JP | 2002-171000 A | 6/2002  |
| JP | 2010-275426 A | 12/2010 |
| JP | 5743044 B1    | 7/2015  |
| WO | 2013-183620 A1| 12/2013 |

\* cited by examiner

FLUORESCENT MATERIAL, LIGHT EMITTING DEVICE, AND METHOD FOR PRODUCING FLUORESCENT MATERIAL

CROSS-REFERENCE TO RELATED APPLICATIONS

This application claims priority to Japanese Patent Application No. 2016-036395, filed on Feb. 26, 2016, and Japanese Patent Application No. 2017-019626, filed on Feb. 6, 2017, the disclosures of which are hereby incorporated by reference in their entirety.

BACKGROUND

Field of the Invention

The present disclosure relates to a fluorescent material, a light emitting device, and a method for producing the fluorescent material.

Description of the Related Art

Light emitting devices may include a light source and a wavelength conversion member. The wavelength conversion member can emit light with hues different from the hue of the light source when excited by the light from the light source. Light emitting devices on the market thus can emit light of various hues as a mixture of three primary colors of light. In particular, light emitting devices including a light emitting diode ("LED") combined with a fluorescent material are increasingly used in a variety of applications including backlights for liquid crystal displays and lighting systems.

As examples of such fluorescent materials, alkaline earth metal aluminate fluorescent materials that emit light from blue-green to green are known, and light emitting devices using such fluorescent materials have been proposed (e.g., JP 2002-171000 A).

SUMMARY

A first aspect of the present disclosure is a method for producing an alkaline earth metal aluminate fluorescent material with high moisture resistance. The method includes preparing fluorescent material particles that contain an alkaline earth metal aluminate having a composition represented by formula (1) below; causing the prepared fluorescent material particles to come into contact with a liquid medium containing water; removing at least a portion of the contacted liquid medium to obtain purified fluorescent material particles; causing a phosphate compound to adhere to the surfaces of the purified fluorescent material particles to obtain fluorescent material particles to which the phosphate compound is adhered; and heat treating the fluorescent material particles to which the phosphate compound is adhered at a temperature from 500° C. to 700° C.

$$(Sr_{1-x}Eu_x)_4Al_{14}O_{25} \tag{1}$$

In formula (1), x satisfies 0.05≤x≤0.4, and a part of Sr may be substituted by at least one element selected from the group consisting of Mg, Ca, Ba, and Zn.

DETAILED DESCRIPTION

Figure 1:
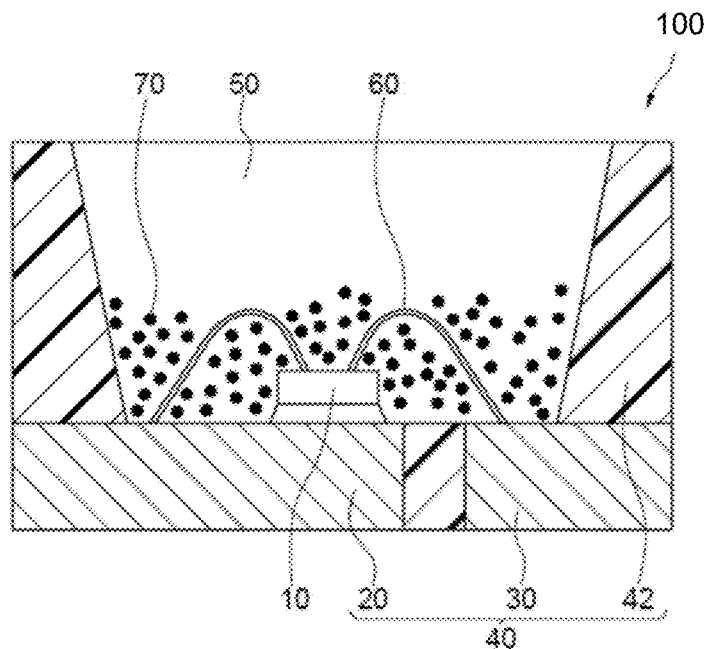
FIG. 1 is a schematic cross-sectional view of a light emitting device according to an embodiment of the present disclosure.

A first aspect of the present disclosure is a method for producing a fluorescent material including preparing fluorescent material particles that contain alkaline earth metal aluminate having a composition represented by formula (1) below; causing the prepared fluorescent material particles to come into contact with a liquid medium containing water; removing at least a portion of the contacted liquid medium to obtain purified fluorescent material particles; causing a phosphate compound to adhere to the surfaces of the purified fluorescent material particles to obtain fluorescent material particles to which the phosphate compound is adhered; and heat treating the fluorescent material particles to which the phosphate compound is adhered at 500° C. to 700° C.

$$(Sr_{1-x}Eu_x)_4Al_{14}O_{25} \tag{1}$$

In formula (1), x satisfies 0.05≤x≤0.4, and a part of Sr may be substituted by at least one element selected from the group consisting of Mg, Ca, Ba, and Zn.

A second aspect of the present disclosure is a fluorescent material including fluorescent material particles that contain alkaline earth metal aluminate, and a phosphate compound arranged on surfaces of the fluorescent material particles, and having an endotherm of 50 J/g or less at 25° C. to 650° C. determined by differential scanning calorimetry.

A third aspect of the present disclosure is a light emitting device including the fluorescent material; and a light-emitting element having a peak emission wavelength in a wavelength range of 380 nm to 470 nm, wherein the ratio of an emission intensity at a peak emission wavelength of the light-emitting element to an emission intensity at a peak emission wavelength of the fluorescent material is 10 or less in an emission spectrum.

According to one embodiment of the present disclosure, a method for producing an alkaline earth metal aluminate fluorescent material with high moisture resistance can be provided.

A method for producing a fluorescent material, the fluorescent material, and a light emitting device according to the present disclosure will now be described. However, the embodiments described below are mere examples for embodying the technical concept of the present invention, and the present invention is not limited to these. The relationship between the color names and the chromaticity coordinates, the relationship between the wavelength ranges of light and the color names of monochromatic light, and others are in accordance with Japanese Industrial Standard (JIS) Z8110. For the amount of each component contained in a composition, when a plurality of substances corresponding to the component exist, the amount of the component means the total amount of the substances present in the composition unless otherwise specified. The average particle diameter of the fluorescent material is a value called Fisher Sub Sieve Sizer's No. determined by an air permeability method with a Fisher Sub Sieve Sizer. The volumetric median particle diameter (Dm) of the fluorescent material is determined by a pore's electrical resistance method based on Coulter principle. Specifically, a particle size distribution is determined using a particle size distribution analyzer (e.g., Multisizer manufactured by Beckman Coulter), and a volumetric median particle diameter (Dm) is obtained as a particle diameter corresponding to a cumulative volume of 50% from a minor diameter side of the particle.

Method for Producing Fluorescent Material

The method for producing a fluorescent material according to the present embodiment includes preparing fluorescent material particles that contain alkaline earth metal aluminate having a specific composition, purifying the prepared fluorescent material particles to obtain purified fluorescent material particles, causing a phosphate compound to adhere to the surfaces of the purified fluorescent material particles to obtain fluorescent material particles to which the phosphate compound is adhered, and heat treating the fluorescent material particles to which the phosphate compound is adhered at a temperature of 500° C. to 700° C. In the fluorescent material obtained by the method according to the present embodiment, a phosphate compound heat treated at a specific temperature is arranged on the surfaces of the alkaline earth metal aluminate-containing fluorescent material particles. This structure allows the fluorescent material to have high moisture resistance.

Alkaline Earth Metal Aluminate

The alkaline earth metal aluminate contained in the fluorescent material particles may be excited by light of from at least 220 nm to 470 nm, and emit light having a peak emission wavelength in the range of 440 nm to 530 nm. Examples of the alkaline earth metal aluminate include fluorescent compounds having a composition represented by the following formulae (1)-(4), and at least one alkaline earth metal aluminate selected from the group consisting of these fluorescent compounds is preferable.

$$(Sr_{1-x}Eu_x)_4Al_{14}O_{25} \quad (1)$$

In formula (1), x satisfies 0.05≤x≤0.4, and a part of Sr may be substituted by at least one element selected from the group consisting of Mg, Ca, Ba, and Zn.

$$(Sr_{1-x-y}Eu_xDy_y)_4Al_{14}O_{25} \quad (2)$$

In formula (2), x+y satisfies 0.05<x+y<0.4, and a part of Sr may be substituted by at least one element selected from the group consisting of Mg, Ca, Ba, and Zn.

$$(Sr_{1-x}Eu_x)Al_2O_4 \quad (3)$$

In formula (3), x satisfies 0.05<x<0.4, and a part of Sr may be substituted by at least one element selected from the group consisting of Mg, Ca, Ba, and Zn.

$$(Sr_{1-x-y}Eu_xDy_y)Al_2O_4 \quad (4)$$

In formula (4), x+y satisfies 0.05<x+y<0.4, and a part of Sr may be substituted by at least one element selected from the group consisting of Mg, Ca, Ba, and Zn.

Of these fluorescent compounds, the alkaline earth metal aluminate is preferably at least one selected from the group consisting of those fluorescent compounds represented by formulae (1) and (3), and more preferably those fluorescent compounds having a composition represented by formula (1) in consideration of emission properties.

Fluorescent Material Particles

The alkaline earth metal aluminate content of the fluorescent material particles is, for example, 80% by mass or more, preferably 90% by mass or more, and more preferably, the fluorescent material particles substantially consist of alkaline earth metal aluminate. A fluorescent material having less impurity phase or crystalline structures other than alkaline earth metal aluminate has higher crystallinity, and can have improved emission efficiency. An average particle diameter of the fluorescent material particles determined by an air permeability method is, for example, 5 μm or more, preferably 10 μm or more, or for example 30 μm or less, and preferably 25 μm or less. The volumetric median particle diameter determined by a pore's electrical resistance method is, for example, 10 μm or more, preferably 15 μm or more, or, for example, 35 μm or less, and preferably 30 μm or less. The fluorescent material particles having an average particle diameter and a volumetric median particle diameter equal to or greater than these lower limits may have improved emission efficiency. With an average particle diameter and a volumetric median particle diameter equal to or smaller than these upper limits, the workability in producing a fluorescent member containing fluorescent material particles may further improve.

In consideration of moisture resistance, the elution of the components of the fluorescent material particles from their surfaces into water should preferably be minimized. For example, the amount of the elution of the fluorescent material particles into pure water at 25° C. is, for example, 300 ppm or less, preferably 50 ppm or less, and more preferably 40 ppm or less in terms of the amount of alkaline earth metal to be detected.

The amount of eluted alkaline earth metal is determined as follows. Into a plastic container with φ65 mm (a capacity of 250 ml), 50 g of fluorescent material particles and 100 ml of pure water are placed. The container is then mounted on a roll mixer, and rotated with stirring at 85 rpm for 2 hours under the environment of 25° C. The supernatant liquid is then sampled, and measured using a high-frequency inductively coupled plasma emission spectral analysis method (ICP-AES).

Fluorescent material particles where the elution of the components is controlled can be prepared, for example, by purifying fluorescent material particles by washing. Specifically, such fluorescent material particles can be prepared by the purifying method including preparing fluorescent material particles that contain alkaline earth metal aluminate; causing the prepared fluorescent material particles to come into contact with a liquid medium containing water; and removing at least a portion of the contacted liquid medium to obtain purified fluorescent material particles.

Fluorescent material particles containing alkaline earth metal aluminate can be prepared in accordance with a production method described in, for example, in "Fluorescent Material Handbook" edited by Fluorescent Material Scientist Academy (published by Ohm Co.), pp. 227-228. A commercially available fluorescent material with desired properties may also be used. The thus prepared fluorescent material particles may undergo treatments such as distribution, filtering, and classifying treatments.

The liquid medium containing water with which the prepared fluorescent material particles are to come into contact may contain an acidic compound. Examples of the acidic compound include hydrochloric acid, nitric acid, sulfuric acid, and acetic acid. The liquid medium containing an acidic compound can have a pH of, for example, 1 to 5.

The amount of the liquid medium with which the fluorescent material particles come into contact is, for example, 1 to 20-fold, and preferably 5 to 15-fold, relative to the fluorescent material particles in mass standard.

The fluorescent material particles may come into contact with the liquid medium by the method of, for example, immersing the fluorescent material particles in the liquid medium with stirring as appropriate. The temperature at the time of contact can be, for example, 15° C. to 40° C., and the duration of contact can be, for example, 1 min to 30 min.

The liquid medium may be removed, for example, by solid-liquid separation, followed by drying as appropriate.

The liquid medium may come into contact with and then be removed from the fluorescent material particles only once or several times.

Phosphate Compound

A phosphate compound is adhered to the surfaces of the fluorescent material particles. Examples of the phosphate compound include phosphates of Group 2 elements (alkaline earth metal), such as magnesium phosphate, calcium phosphate, strontium phosphate, and barium phosphate; rare-earth phosphate such as scandium phosphate, yttrium phosphate, lanthanoid (La, Ce, Pr, Nd, Pm, Sm, Eu, Gd, Tb, Dy, Ho, Er, Tm, Yb, and Lu) phosphate; and phosphates of Group 13 elements, such as boron phosphate, aluminium phosphate, gallium phosphate, and indium phosphate; zinc phosphate, antimony phosphate, and bismuth phosphate. At least one phosphate compound selected from the group consisting of these phosphates is preferable. More preferred is at least one phosphate compound selected from the group consisting of phosphates of Group 2 elements, rare-earth phosphates, and phosphates of Group 13 elements. Still more preferred is at least one phosphate compound selected from the group consisting of magnesium phosphate, calcium phosphate, strontium phosphate, barium phosphate, aluminium phosphate, gallium phosphate, scandium phosphate, yttrium phosphate, and lanthanoid phosphate including lanthanum phosphate.

Particularly preferred is at least one phosphate compound selected from the group consisting of magnesium phosphate, calcium phosphate, strontium phosphate, barium phosphate, yttrium phosphate, and lanthanoid phosphate including lanthanum phosphate.

The methods for causing a phosphate compound to adhere to the surfaces of the fluorescent material particles may include a method of allowing a desired phosphate compound to adhere to the surfaces of the fluorescent material particles by wet- or dry-dispersing the compound; a method of producing a desired phosphate compound in a liquid medium and allowing the compound to adhere to the surfaces of the fluorescent material particles; and dry-spraying a slurry that contains a phosphate compound onto the surfaces of the fluorescent material particles. Of these methods, preferred is the method of producing a desired phosphate compound in a liquid medium and allowing the compound to adhere to the surfaces of the fluorescent material particles in consideration of moisture resistance.

The method of producing a desired phosphate compound in a liquid medium and allowing the compound to adhere to the surfaces of the fluorescent material particles includes, for example, causing a cation and a phosphate ion for forming the phosphate compound to come into contact with each other in a liquid medium that contains the fluorescent material particles. Causing the cation and the phosphate ion for forming the phosphate compound to come into contact with each other produces a desired phosphate compound, and the resultant phosphate compound precipitates on the surfaces of the fluorescent material particles. Thus, the phosphate compound adheres to the surfaces of the fluorescent material particles. Alternatively, the cation and the phosphate ion for forming the phosphate compound may be caused to come into contact with each other in a liquid medium to yield a desired phosphate compound, and then the resultant compound may be caused to come into contact with the fluorescent material particles.

For example, the phosphate compound may contain magnesium phosphate, calcium phosphate, strontium phosphate, barium phosphate, aluminium phosphate, gallium phosphate, scandium phosphate, yttrium phosphate, or lanthanoid phosphate. In such a case, causing a phosphate ion to come into contact with at least one cation selected from the group consisting of calcium ion, magnesium ion, strontium ion, barium ion, aluminum ion, gallium ion, scandium ion, yttrium ion, and lanthanoid ion allows the phosphate compound to adhere to the surfaces of the fluorescent material particles. Alternatively, for example, the phosphate compound may contain magnesium phosphate, calcium phosphate, strontium phosphate, barium phosphate, yttrium phosphate, or lanthanoid phosphate. In such a case, causing at least one cation selected from the group consisting of calcium ion, magnesium ion, strontium ion, barium ion, yttrium ion, and lanthanoid ion to come into contact with a phosphate ion allows the phosphate compound to adhere to the surfaces of the fluorescent material particles. Alternatively, a cation and a phosphate ion for forming the phosphate compound may be caused to come into contact with each other in a liquid medium to yield a desired phosphate compound, and then the resultant phosphate compound may be caused to come into contact with the fluorescent material particles to allow the phosphate compound to adhere to the particles.

A cation (hereinafter also referred to as "specific cation") and a phosphate ion for forming the phosphate compound can be caused to come into contact with each other by, for example, adding a solution containing the phosphate ion and a solution containing the specific cation to a liquid medium containing the fluorescent material particles. Alternatively, a solution containing the specific cation may be added to a liquid medium containing the fluorescent material particles and a phosphate ion.

The liquid medium used for causing the specific cation and a phosphate ion to come into contact with each other may contain, for example, water, and an organic solvent, a pH adjuster, and other additives as appropriate. Examples of the organic solvent that may be contained in the liquid medium include alcohols, such as ethanol and isopropanol.

Examples of the pH adjuster include basic compounds, such as ammonia, sodium hydroxide, and potassium hydroxide; and acidic compounds, such as hydrochloric acid, nitric acid, sulfuric acid, and acetic acid. When the liquid medium contains a pH adjuster, the liquid medium has a pH of, for example, 4 to 12, and preferably 6 to 9. The pH of the liquid medium is a value measured for the medium containing the cation and the phosphate ion for forming the phosphate compound.

The mass ratio of the liquid medium to the fluorescent material particles is, for example, from 100% by mass to 1000% by mass, and preferably 200% by mass to 800% by mass. When the mass ratio of the liquid medium is equal to or greater than the lower limit, the phosphate compound can more easily be uniformly adhered to the surfaces of the fluorescent material particles. When the mass percentage of the liquid medium is equal to or less than the upper limit, the phosphate compound can adhere to the fluorescent material in a higher ratio.

Examples of the phosphate ion include orthophosphate ion, polyphosphate (metaphosphate) ion, phosphite ion, and hypophosphite ion. Examples of the polyphosphate ion include polyphosphate ions with a straight-chain structure, such as pyrophosphate ion and tripolyphosphate ion; and cyclic polyphosphate ions, such as hexametaphosphate ion.

The solution containing the phosphate ion is a solution where a compound that serves as a phosphate ion source is dissolved in a solvent, such as water. Specific examples of the sources of the phosphate ion include phosphoric acid; metaphosphoric acid; alkali metal salts of phosphoric acid, such as sodium phosphate and potassium phosphate; alkali metal salts of hydrogen phosphoric acid, such as sodium hydrogen phosphate and potassium hydrogen phosphate; alkali metal dihydrogen phosphate, such as sodium dihydrogen phosphate and potassium dihydrogen phosphate; alkali metal salts of hexametaphosphoric acid, such as sodium hexametaphosphate and potassium hexametaphosphate; alkali metal salts of pyrophosphoric acid, such as sodium pyrophosphate and potassium pyrophosphate; and ammonium salts of phosphoric acid, such as ammonium phosphate.

The phosphate ion source content of a liquid medium in which the specific cation and the phosphate ion are to come into contact with each other is, for example, 0.1% by mass to 5.0% by mass, and preferably 0.2% by mass to 3.0% by mass in terms of the phosphate ion ($PO_4^{3-}$) equivalents. The phosphate ion source content relative to the fluorescent material particles in the liquid medium is, for example, 0.5% by mass to 20.0% by mass, and preferably 1.0% by mass to 10.0% by mass. When the phosphate ion source content is equal to or greater than the lower limit, the phosphate compound can adhere to the fluorescent material in a higher ratio. When the phosphate ion source content is equal to or less than the upper limit, the phosphate compound can more easily be uniformly adhered to the surfaces of the fluorescent material particles.

The solution containing the specific cation can be prepared by dissolving the compound that serves as the cation source (e.g., a metal salt) in a solvent, such as water. Examples of the anion of the metal salt include nitrate ion, sulphate ion, acetate ion, and chloride ion.

The specific cation content of the liquid medium for allowing the specific cation to come into contact with the phosphate ion is, for example, from 0.05% by mass to 4.0% by mass, and preferably 0.1% by mass to 3.0% by mass. The specific cation content relative to the fluorescent material particles in the liquid medium is, for example, 0.1% by mass to 15% by mass, and preferably 0.2% by mass to 8.0% by mass. When the specific cation content is equal to or greater than the lower limit, the phosphate compound can adhere to the fluorescent material particles in a higher ratio. When the specific cation content is equal to or less than the upper limit, the phosphate compound can more easily be uniformly adhered to the surfaces of the fluorescent material particles.

The temperature at which the cation and the phosphate ion for forming the phosphate compound are come into contact with each other, or the contact temperature, is, for example, from 10° C. to 50° C., and preferably 20° C. to 35° C. The duration of the contact is, for example, 1 min to 1 hour, and preferably 3 min to 30 min. The contact may be carried out in the liquid medium with stirring.

After the phosphate compound is adhered to the fluorescent material particles, for example, solid-liquid separation and drying treatment may be carried out to yield fluorescent material particles to which the phosphate compound is adhered. The drying treatment may be carried out at room temperature or with heating. When the drying treatment is carried out with heating, for example, the temperature may be 95° C. to 115° C.

The phosphate compound may be adhered to the surfaces of the fluorescent material particles by any reaction including a physical interaction, such as a van der Waals force or an electrostatic interaction, or a chemical interaction involved in a partial chemical reaction. The phosphate compound may adhere in the form of a film or microparticles. In consideration of moisture resistance, the phosphate compound preferably adheres at least partially in the form of a film.

The amount of adhesion of the phosphate compound to the fluorescent material particles is, for example 0.0001% by mass to 20% by mass, preferably 0.1% by mass to 10% by mass, and more preferably 1.5% by mass to 5.6% by mass in terms of phosphoric acid content. When the amount of adhesion of the phosphate compound is equal to or greater than the lower limit, sufficient moisture resistance can be achieved. When the amount of adhesion of the phosphate compound is equal to or less than the upper limit, decrease in emission properties of the fluorescent material can be reduced. The metal content of the phosphate compound is 0.0001% by mass to 20% by mass, preferably 0.01% by mass to 10% by mass, and more preferably 0.36% by mass to 1.4% by mass. When the metal content is within this range, the crystalline structure and the composition of the phosphate compound can be more effective in achieving the object of the present invention.

The phosphoric acid content and the metal content of the phosphate compound that is adhered to the fluorescent material particles can be each determined by using ICP-AES. The phosphoric acid content is a value in terms of the phosphate ion equivalents ($PO_4^{3-}$). The phosphate compound content that is adhered to the fluorescent material particles is obtained as the sum of the phosphoric acid content and the metal content of the phosphate compound.

Heat Treatment

The fluorescent material particles to which the phosphate compound has been adhered undergoes heat treatment at 500° C. to 700° C., and preferably 550° C. to 650° C. Heat treatment within a specific range of temperatures allows the fluorescent material to have high moisture resistance and emission efficiency. This may be because, for example, adsorbed water or crystal water is removed by heat treatment, or the crystallinity, chemical stability, or other properties of the adhered phosphate compound are improved by heat treatment to achieve high moisture resistance.

The duration of heat treatment is, for example, for 1 hour to 20 hours, and preferably 3 hours to 15 hours.

The atmosphere during the heat treatment may be, for example, the atmospheric air or an inert gas atmosphere, or an atmosphere where an inert gas is mixed in the atmospheric air. Examples of the inert gas include rare gases such as nitrogen, helium, and argon. The atmosphere of the heat treatment is preferably non-reducing atmosphere or low reducing atmosphere, where, for example, the concentration of hydrogen gas is 3 volume % or less, and preferably 1 volume % or less. The pressure during the heat treatment is, for example, 0.05 MPa to 0.2 MPa.

The fluorescent material that underwent heat treatment may undergo crushing treatment, dispersing treatment, sieving treatment, classifying treatment, and other treatments as appropriate.

The manufacturing method described above efficiently produces a fluorescent material including fluorescent material particles that contain alkaline earth metal aluminate, and a phosphate compound arranged on the surfaces of the fluorescent material particles. The fluorescent material has an endotherm of 50 J/g or less at 25° C. to 650° C., determined by a differential scanning calorimetry. The resulting fluorescent material has high moisture resistance.

Fluorescent Material

The fluorescent material according to the present disclosure includes fluorescent material particles that contain alkaline earth metal aluminate, and the phosphate compound arranged on the surfaces of the fluorescent material particles, and having an endotherm of 50 J/g or less at 25° C. to 650° C. determined by a differential scanning calorimetry.

The fluorescent material according to the present disclosure includes the phosphate compound arranged on the surfaces of the fluorescent material particles of the fluorescent material. The phosphate compound has an endotherm of a specific value or less in a specific temperature range. This provides high moisture resistance. The fluorescent material can be produced by for example the method for producing a fluorescent material described above.

The alkaline earth metal aluminate may be excited by light of at least from 220 nm to 470 nm, and emits light having a peak emission wavelength in the range of 440 nm to 530 nm. Specifically, the alkaline earth metal aluminate is preferably a compound having a composition represented by a formula selected from the group consisting of formulae (1) to (4) described above, preferably at least a compound having a composition represented by a formula selected from formulae (1) and (3), and more preferably a compound having a composition represented by formula (1) in consideration of emission properties.

$(Sr_{1-x}Eu_x)_4Al_{14}O_{25}$  (1)

In formula (1), x satisfies 0.05≤x≤0.4, and a part of Sr may be substituted by at least one element selected from the group consisting of Mg, Ca, Ba, and Zn. In consideration of emission efficiency, x preferably satisfies 0.1≤x≤0.3. When a part of Sr is substituted by at least one element selected from the group consisting of Mg, Ca, Ba, and Zn, the amount of substitution is, for example, 50% by mol or less, and preferably 1% by mol to 30% by mol.

The phosphate compound is arranged on the surfaces of the fluorescent material particles. The details of the phosphate compound are as described above, and preferred embodiments are also as described above. The phosphate compound may be arranged by any of a physical interaction, such as a van der Waals force, or an electrostatic interaction, or a chemical interaction involved in a partial chemical reaction. The phosphate compound may be arranged in the form of a film or particles. To further enhance moisture resistance, the phosphate compound is preferably arranged in the form of a film. The phosphate compound arranged in the form of a film means that particles of the phosphate compound cannot be observed and that 50% or more, preferably 70% or more of the area of the surfaces of the fluorescent material particles is covered with the phosphate compound.

The phosphate compound content of the fluorescent material is, for example, 0.0001% by mass to 20% by mass, and preferably 0.1% by mass to 10% by mass, more preferably 1% by mass to 8% by mass, and still more preferably 1.5% by mass to 5.6% by mass in terms of the phosphoric acid content of the total mass of the fluorescent material. When the phosphate compound content is equal to or greater than the lower limit, sufficient moisture resistance can be achieved. When the phosphate compound content is equal to or less than the upper limit, decrease in the emission properties of the fluorescent material can be reduced. The metal content of the phosphate compound is 0.0001% by mass to 20% by mass, preferably 0.01% by mass to 10% by mass, more preferably 0.2% by mass to 3% by mass, and still more preferably 0.36% by mass to 1.4% by mass. Within this range, the crystalline structure and the composition of the phosphate compound can be more effective in achieving the object of the present invention.

The phosphoric acid content of the fluorescent material and the metal content of the phosphate compound can be determined by using ICP-AES. The phosphoric acid content is a value in terms of $PO_4$ equivalents The phosphate compound content of the fluorescent material particles to which the phosphate compound is adhered is obtained as the sum of the phosphoric acid content and the metal content of the phosphate compound.

The fluorescent material has an endotherm, determined by a differential scanning calorimetry (DSC), of 50 J/g or less, preferably 20 J/g or less, more preferably 15 J/g or less, and still more preferably essentially 0 J/g at 25° C. to 650° C. For example, when fluorescent material particles to which the phosphate compound is adhered according to the above-described method is heat treated at a specific temperature, the adhered phosphate compound absorbs heat and changes physically or chemically. This physical or chemical change is considered to provide high moisture resistance to the fluorescent material. Thus, a heat-treated fluorescent material having an endotherm of a specific value or less indicates that the phosphate compound adhered to the fluorescent material has undergone sufficient physical or chemical change.

The fluorescent material preferably contains 1.5% by mass to 5% by mass of the phosphate compound and has an endotherm determined by DSC of preferably 20 J/g or less at 25° C. to 650° C.; more preferably contains 1.86% by mass to 3.24% by mass of the phosphate compound, and has an endotherm determined by DSC of 20 J/g or less at 25° C. to 650° C.; and still more preferably contains 5.2% by mass to 7.0% by mass of the phosphate compound, and has an endotherm determined by DSC of 50 J/g or less at 25° C. to 650° C.

A DSC curve obtained by plotting temperature on horizontal axis and heat quantity on vertical axis has an endothermic trough. An endotherm is calculated as a value corresponding to an area defined by a straight line connecting the shoulders of the endothermic trough and the DSC curve. When there are multiple endothermic troughs within a predetermined temperature range, the endotherm is a value or the sum of the areas defined corresponding to the respective endothermic troughs. If there is no observable endothermic trough in a DSC curve, the endotherm is regarded essentially as 0 J/g.

The fluorescent material is preferably prepared by heat treating fluorescent material particles to which the phosphate compound is adhered at a specific temperature or less in consideration of emission efficiency. In the fluorescent material heat treated at a specific temperature or less, for example, the relative intensity at 270 nm can be 60% or more, and preferably 70% or more when the maximum peak intensity in the excitation spectrum is taken as 100%.

The average particle diameter, determined by using an air permeability technique, of the heat treated fluorescent material is, for example, 5 μm or more, and preferably 10 μm or more, and, for example, 30 μm or less, and preferably 25 μm or less. The volumetric median particle diameter, determined by using a pore's electrical resistance method, of the heat treated fluorescent material is, for example, 10 μm or more, and preferably 15 μm or more, and, for example, 35 μm or less, and preferably 30 μm or less.

Light Emitting Device

The light emitting device includes the fluorescent material (hereinafter also referred to as "first fluorescent material"), and a light-emitting element having a peak emission wavelength in a wavelength range of 380 nm to 470 nm. In the emission spectrum, the ratio of the emission intensity at a peak emission wavelength of the light-emitting element relative to the emission intensity at a peak emission wavelength of the fluorescent material is 10 or less. Combining the fluorescent material and the light-emitting element provides a light emitting device with high moisture resistance. The light emitting device can further include another fluorescent material (hereinafter also referred to as "second fluorescent material").

Examples of the forms of the light emitting device include through-hole mounting and surface mounting types. In through-hole mounting, generally, a light-emitting device is fixed to a mount board by placing leads of the light-emitting device into through-holes formed in the mount board. In contrast, with surface mounting, the leads of the light-emitting device are fixed to the surface of the mount board.

Figure 2:
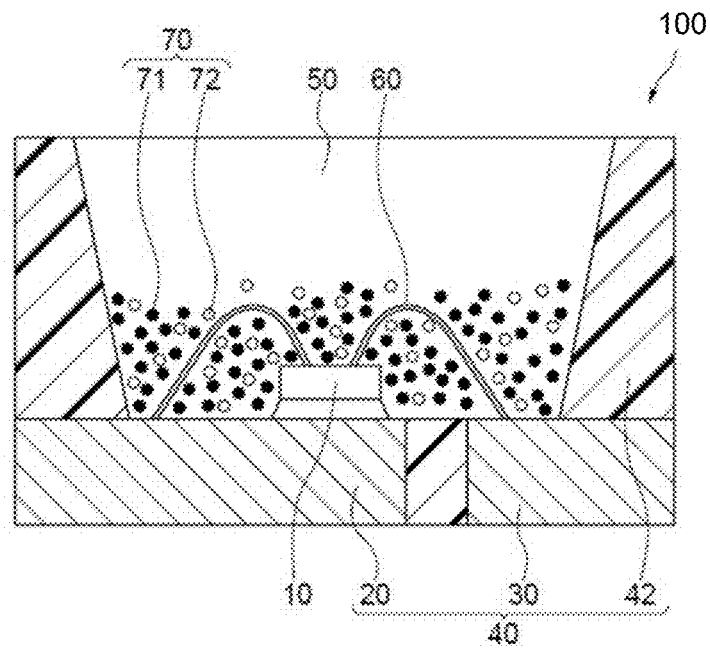
FIG. 2 is a schematic cross-sectional view of a light emitting device according to another embodiment of the present disclosure.

A light emitting device 100 according to an embodiment of the present disclosure will now be described with reference to the drawings. FIGS. 1 and 2 are schematic cross-sectional views of a light emitting device 100. The light emitting device 100 is an example surface-mounting type light emitting device.

The light emitting device 100 includes a light-emitting element 10 formed from a gallium nitride compound semiconductor, and a molded body 40 on which the light-emitting element 10 is disposed. The light-emitting element 10 emits visible light at short-wavelengths (e.g., a range of 380 nm to 485 nm) and has a peak emission wavelength in the range of 430 nm to 470 nm. The molded body 40 includes a first lead 20 and a second lead 30, and a resin portion 42 including a thermoplastic or thermosetting resin in an integral manner. The molded body 40 has a recess defined by a bottom surface and side surfaces, and the light emitting element 10 is disposed on the bottom surface of the recess. The light emitting element 10 has a pair of electrodes, positive and negative, and the positive and negative electrodes are electrically connected to the first lead 20 and the second lead 30, respectively, with a wire 60. The light emitting element 10 is covered with a fluorescent member 50. For example, in FIG. 1, the fluorescent member 50 includes a fluorescent material 70 that converts the wavelength of light emitted from the light emitting element 10, and a resin. In FIG. 2, the fluorescent member 50 includes a first fluorescent material 71 and a second fluorescent material 72 as the fluorescent material 70, and a resin.

The fluorescent member 50 serves not only as a member to convert the wavelength of light emitted from the light-emitting element 10, but also as a member to protect the light emitting element 10 from outside environment. In FIGS. 1 and 2, particles of the fluorescent material 70 are unevenly dispersed in the fluorescent member 50. Arranging the particles of the fluorescent material 70 closer to the light emitting element 10 in this manner allows the fluorescent material 70 to efficiently convert the wavelength of light from the light emitting element 10 so as to provide a light emitting device with high light emitting efficiency. It should be noted, however, that the arrangement of the fluorescent member 50 including the particles of the fluorescent material 70 and the light emitting element 10 is not limited to one in which they are in close proximity to each other, and the particles of the fluorescent material 70 may be arranged spaced apart from the light emitting element 10 within the fluorescent member 50 to avoid the influence of heat on the fluorescent material 70. The fluorescent material 70 may also be approximately evenly dispersed in the entire fluorescent member 50 to obtain light with reduced color unevenness.

In FIG. 2, the fluorescent material 70 includes particles of the first fluorescent material 71 and particles of the second fluorescent material 72. The particles of the second fluorescent material 72 may be arranged on the particles of the first fluorescent material 71 (not shown), or the particles of the first fluorescent material 71 may be arranged on the particles of the second fluorescent material 72 (not shown).

Light-Emitting Element

The peak emission wavelength of the light-emitting element is in the range of 430 nm to 470 nm, preferably in the range of 440 nm to 460 nm, and more preferably in the range of 445 nm to 455 nm in consideration of the emission efficiency of the light emitting device. Using such a light-emitting element as an excitation light source, a light emitting device that emit mixed light of light from light-emitting element and fluorescent light from the fluorescent material is formed.

The half bandwidth of the emission spectrum of the light-emitting element can be, for example, 30 nm or less.

For the light-emitting element, a semiconductor light-emitting element such as an LED is preferably used. Using a semiconductor light emitting element as the light source provides a highly efficient light emitting device that has high output linearity to the input and is resistant and stable to mechanical impact.

For example, a semiconductor light emitting element that includes a nitride semiconductor ($In_XAl_YGa_{1-X-Y}N$, wherein X and Y satisfy $0 \leq X$, $0 \leq Y$, and $X+Y \leq 1$) and emits blue light may be used as the semiconductor light emitting element.

First Fluorescent Material

The light emitting device includes at least a first fluorescent material. The first fluorescent material includes fluorescent material particles and a phosphate compound arranged on the surfaces of the particles. The fluorescent material particles contain alkaline earth aluminate. The details of the first fluorescent material are as described above, and preferred embodiments are also as described above.

The first fluorescent material and a resin are included in the fluorescent member, and the fluorescent member is included in the light emitting device. The first fluorescent material is contained in an amount of, for example, 2% by mass or more, preferably 10% by mass or more, and more preferably 40% by mass or more, and, for example, 190% by mass or less, preferably 160% by mass or less, and more preferably 130% by mass or less relative to the amount of the resin in the fluorescent member.

In the light emitting device, the ratio of the emission intensity at a peak emission wavelength of the light-emitting element to the emission intensity of the first fluorescent material at a peak emission wavelength (hereinafter also referred to as "emission intensity ratio") is 10 or less, and preferably 1 or less. The emission intensity ratio is also, for example, 0.2 or more, and preferably 0.4 or more. The peak emission wavelength of the first fluorescent material is a wavelength that gives a maximum value of the relative intensity in the wavelength range of 485 nm to 500 nm in the emission spectrum of the light emitting device. The emission intensity ratio can be controlled by adjusting the amount of the first fluorescent material contained in the light emitting device.

The emission spectrum of the light emitting device with an emission intensity ratio of 10 or less is, for example, close to the spectrum of sunlight having been transmitted through the seawater to a certain depth. This allows one to expect that the light emitting device can be used, for example, as a fish collecting lamp with high moisture resistance to achieve a high fish collecting effect.

Second Fluorescent Material

The light emitting device of the embodiment may further include as a fluorescent material in addition to the first fluorescent material, a second fluorescent material having a different peak emission wavelength from that of the first fluorescent material. The light emitting device having the second fluorescent material can emit light of various color hues.

An example second fluorescent material can be a fluorescent material with a peak emission wavelength in the wavelength range of 450 nm to 700 nm.

Specifically, the second fluorescent material can be a fluorescent material having a composition represented by any one of the following formulae (I) to (X). As the second fluorescent material, at least one selected from these fluorescent materials can be used.

$$(Ca_{1-p-q}Sr_pEu_q)AlSiN_3 \quad (I)$$

In formula (I), p and q satisfy $0 \leq p \leq 1.0$, $0 < q < 1.0$ and $p+q < 1.0$.

$$(Ca_{1-r-s-t}Sr_rBa_sEu_t)_2Si_5N_8 \quad (II)$$

In formula (II), r, s, and t satisfy $0 \leq r \leq 1.0$, $0 \leq s \leq 1.0$, $0 < t < 1.0$, and $r+s+t \leq 1.0$.

$$A_2[M^1_{1-u}Mn_uF_6] \quad (III)$$

In formula (III), A is at least one selected from the group consisting of K, Li, Na, Rb, Cs, and $NH_4$; $M^1$ is at least one element selected from the group consisting of Group 4 elements and Group 14 elements, and u satisfies $0 < u < 0.2$.

$$(i-j)MgO \cdot (j/2)Sc_2O_3 \cdot kMgF_2 \cdot mCaF_2 \cdot (1-n)GeO_2 \cdot (n/2) M^f_2O_3 : zMn \quad (IV)$$

In formula (IV), $M^f$ is at least one selected from the group consisting of Al, Ga, and In; and i, j, k, m, n, and z respectively satisfy $2 \leq i \leq 4$, $0 < k < 1.5$, $0 < z < 0.05$, $0 \leq j < 0.5$, $0 < n < 0.5$, and $0 \leq m < 1.5$.

$$M^{11}_8MgSi_4O_{16}X^{11}_2:Eu \quad (V)$$

In formula (V), $M^{11}$ is at least one selected from the group consisting of Ca, Sr, Ba, and Zn; and $X^{11}$ is at least one selected from the group consisting of F, Cl, Br, and I.

$$Si_{6-z}Al_zO_zN_{8-z}:Eu \quad (VI)$$

In formula (VI), z satisfies $0 < z < 4.2$.

$$M_{m/n}Si_{12-(m+n)}Al_{(m+n)}O_nN_{(16-n)}:Eu \quad (VII)$$

In formula (VII), M is at least one selected from the group consisting of Sr, Ca, Li, and Y; n is 0 to 2.5; m is 0.5 to 5; n is the electric charge of M; and x is 0.75 to 1.5.

$$M^{13}Ga_2S_4:Eu \quad (VIII)$$

In formula (VIII), $M^{13}$ is at least one selected from the group consisting of Mg, Ca, Sr, and Ba.

$$(Y,Lu,Gd,Tb)_3(Al,Ga)_5O_{12}:Ce \quad (IX)$$

$$M^a_vM^b_wM^c_xAl_{3-y}Si_yN_z \quad (X)$$

In formula (X), $M^a$ is at least one element selected from the group consisting of Ca, Sr, Ba, and Mg; $M^b$ is at least one element selected from the group consisting of Li, Na, and K; $M^c$ is at least one element selected from the group consisting of Eu, Ce, Tb, and Mn; and v, w, x, y, and z respectively satisfy $0.80 \leq v \leq 1.05$, $0.80 \leq w \leq 1.05$, $0.001 < x \leq 0.1$, $0 \leq y \leq 0.5$, and $3.0 \leq z \leq 5.0$.

When the light emitting device includes a fluorescent member including a second fluorescent material in addition to a first fluorescent material and a resin, the second fluorescent material is contained in an amount of, for example, 1% by mass or more, preferably 5% by mass or more, and more preferably 10% by mass or more, and for example, 200% by mass or less, preferably 150% by mass or less, and more preferably 100% by mass or less relative to the amount of the resin.

Fluorescent Member

The light emitting device includes, for example, a fluorescent member that contains a fluorescent material and a resin, and converse a light-emitting element. Examples of the resin to be included in the fluorescent member include thermoplastic resins and thermosetting resins. Specific examples of the thermosetting resins include modified silicone resins, such as epoxy resins, silicone resins, and epoxy-modified silicone resins.

The fluorescent member may include other components in addition to the fluorescent material and the resin as appropriate. Examples of the other components include a filler, such as silica, barium titanate, titanium oxide, and aluminium oxide; a light stabilizer; and a colorant. When the fluorescent member includes other components, the amount to be contained may be appropriately selected according to the purpose, for example. When, for example, a filler is included as one of such other components, the amount to be contained may be 0.01% by mass to 20% by mass relative to the resin.

EXAMPLES

Examples according to the present invention will now be specifically described.

MANUFACTURING EXAMPLES

Method for Producing Fluorescent Material Particles
Method for Producing Alkaline Earth Metal Aluminate Fluorescent Material An alkaline earth metal aluminate fluorescent material having a composition represented by formula (1) was prepared in accordance with the production method described, for example, in "Fluorescent Material Handbook" edited by Fluorescent Material Scientist Academy (published by Ohm Co.), pp. 227-228. Specifically, the raw materials were weighed in accordance with the amounts shown in Table 1, subjected to dry blending, and burned in a reducing atmosphere at 1350° C. for 10 hours. Further, after dispersing, coarse particles and microparticles were removed by, for example, wet sieving to prepare alkaline earth metal aluminate fluorescent materials A to F. Table 2 shows their powder characteristics

TABLE 1

| | Composition | Raw materials (g) | | | | |
|---|---|---|---|---|---|---|
| | | $SrCO_3$ | $Eu_2O_3$ | $Al_2O_3$ | $AlF_3$ | $H_3BO_3$ |
| Fluorescent material A | $(Sr_{3.9}, Eu_{0.1})Al_{14}O_{25}$ | 176.1 | 5.4 | 218.5 | 2.0 | 2.0 |
| Fluorescent material B | $(Sr_{3.8}, Eu_{0.2})Al_{14}O_{25}$ | 171.3 | 10.7 | 218.0 | 2.0 | 2.0 |
| Fluorescent material C | $(Sr_{3.6}, Eu_{0.4})Al_{14}O_{25}$ | 161.5 | 21.4 | 217.1 | 2.0 | 2.0 |
| Fluorescent material D | $(Sr_{3.3}, Eu_{0.7})Al_{14}O_{25}$ | 147.1 | 37.2 | 215.7 | 2.0 | 2.0 |
| Fluorescent material E | $(Sr_{2.8}, Eu_{1.2})Al_{14}O_{25}$ | 123.5 | 63.1 | 213.4 | 2.0 | 2.0 |
| Fluorescent material F | $(Sr_{2.4}, Eu_{1.6})Al_{14}O_{25}$ | 105.0 | 83.4 | 211.6 | 2.0 | 2.0 |

TABLE 2

| | Average particle diameter (μm) | Dm (μm) | Emission properties (450 nm) | | ENG (%) | Excitation spectrum relative intensity (%) |
|---|---|---|---|---|---|---|
| | | | x | y | | |
| Fluorescent material A | 10.6 | 16.1 | 0.148 | 0.426 | 100.5 | 93.8 |
| Fluorescent material B | 10.2 | 16.1 | 0.147 | 0.436 | 126.0 | 91.4 |
| Fluorescent material C | 11.2 | 16.9 | 0.148 | 0.443 | 154.1 | 89.7 |
| Fluorescent material D | 13.0 | 18.7 | 0.150 | 0.463 | 175.6 | 87.8 |
| Fluorescent material E | 12.6 | 16.1 | 0.151 | 0.458 | 165.3 | 80.1 |
| Fluorescent material F | 12.4 | 14.9 | 0.150 | 0.453 | 153.8 | 73.4 |

The average particle diameters shown in Table 2 are Fisher Sub Sieve Sizer's Nos. determined by an air permeability method using a Fisher Sub Sieve Sizer (by Fisher). Each Dm, or a volumetric median particle diameter, was determined by a pore's electrical resistance method using a Coulter Multisizer II (manufactured by Beckman Coulter Inc.).

Table 2 shows the emission properties including the chromaticity coordinates, x and y, and the ENG value of fluorescent light emitted from each fluorescent material when excited by light with 450 nm. The ENG values, which indicate emission intensities, are shown as relative values using Fluorescent material 1 obtained in Example 1, described later, as a reference. Table 2 also shows each relative intensity (%) at 270 nm as a relative intensity (%) in the corresponding excitation spectrum when the maximum intensity in the corresponding excitation spectrum is taken as 100%.

Fluorescent material A corresponds to a fluorescent material in formula (1) wherein x is 0.1/4=0.025; Fluorescent material B corresponds to a fluorescent material in formula (1) wherein x is 0.2/4=0.05. In the same manner, the value of x is calculated for Fluorescent materials C to F.

Example 1

Fluorescent material B synthesized in the above-described method was used as fluorescent material particles. 300 g of pure water was added to 150 g of Fluorescent material B and stirred to obtain a dispersed liquid. To the dispersed liquid, 245.1 g of a sodium phosphate solution (phosphate ion content: 2.25% by mass) was added dropwise. Subsequently, 174.5 g of calcium nitrate solution (Ca content: 2.0% by mass) was added dropwise. Further, an NaOH solution was added to adjust the pH to 7.5 to obtain a reaction solution. The reaction solution was stirred at room temperature (25° C.) for 1 hour, and filtered and solid-liquid separated, and then dried to obtain fluorescent material particles to which the phosphate compound was adhered.

The resultant fluorescent material particles to which the phosphate compound was adhered was subjected to an ICP-AES to detect a phosphate compound where phosphoric acid in terms of the phosphate ion equivalents ($PO_4^{3-}$) was analyzed to be 2.6% by mass, and that of Ca was 0.62% by mass.

The fluorescent material particles were further heat treated at 600° C. for 10 hours in the atmospheric air to obtain Fluorescent material 1.

The powder characteristics and the analysis values of Fluorescent material 1 are shown in Table 3.

Examples 2 to 6

Fluorescent materials 2 to 6 were prepared in the same manner as Example 1 except that Fluorescent materials C to F and A were respectively used as fluorescent material particles in place of Fluorescent material B. The powder characteristics and the analysis values of the resultant fluorescent materials are shown in Table 3.

Example 7

Fluorescent material 7 was prepared in the same manner as Example 1 except that Fluorescent material D was used as fluorescent material particles; that the amount of the sodium phosphate solution (phosphate ion content: 2.25% by mass) added dropwise was changed to 122.4 g; and that the amount of the calcium nitrate solution (Ca content: 2.0% by mass) added dropwise was changed to 87.2 g. The powder characteristics and the analysis values of Fluorescent material 7 are shown in Table 3.

Example 8

Fluorescent material 8 was prepared in the same manner as Example 1 except that Fluorescent material D was used as fluorescent material particles, that the amount of the sodium phosphate solution (phosphate ion content: 2.25% by mass) added dropwise was changed to 367.6 g, and that the amount of calcium nitrate solution (Ca content: 2.0% by mass) added dropwise was changed to 261.8 g. The powder characteristics and the analysis values of Fluorescent material 8 are shown in Table 3.

Example 9

Fluorescent material particles 9p, to which the phosphate compound was adhered, (hereinafter simply referred to as "Fluorescent material particles 9p") were prepared in the same manner as Example 1 except that Fluorescent material D was used as fluorescent material particles, that the amount of the sodium phosphate solution (phosphate ion content: 2.25% by mass) added dropwise was changed to 489.8 g, and that the amount of the calcium nitrate solution (Ca content: 2.0% by mass) added dropwise was changed to 348.8 g. Fluorescent material particles 9p were then heat treated in the same manner as described above to prepare Fluorescent material 9. The powder characteristics and the analysis values of Fluorescent material 9 are shown in Table 3.

Example 10

Fluorescent material 10 was prepared in the same manner as Example 3 except that the atmosphere of the heat treatment was changed to the nitrogen atmosphere. The powder characteristics and the analysis values of Fluorescent material 10 are shown in Table 3.

Example 11

150 g of Fluorescent material D was placed and washed in 1500 ml of an acidic solution (hydrochloric acid: 0.2% by mass), then solid-liquid separated, and further washed and dried to obtain purified Fluorescent material D1.

Fluorescent material 11 was prepared in the same manner as Example 10 except that Fluorescent material D1 was used. The powder characteristics and the analysis values of Fluorescent material 11 are shown in Table 3.

50 g of Fluorescent material D1 and 100 ml of pure water were placed in a plastic container of 250 ml with φ65 mm, and rotated at 85 rpm for 2 hours. Sr content of the supernatant liquid was analyzed to be 35 ppm, whereas Sr content of Fluorescent material D analyzed in the same manner was found to be 250 ppm.

Example 12

150 g of Fluorescent material D was placed and washed in 1500 ml of an acidic solution (hydrochloric acid: 0.2% by mass), then solid-liquid separated, and further washed and solid-liquid separated to obtain purified Fluorescent material D2. The resultant analysis value of Sr of Fluorescent material D2 was the same as Fluorescent material D1.

Fluorescent material 12 was prepared in the same manner as Example 10, by heat treating the fluorescent material after the phosphate compound was adhered to the fluorescent material, except that Fluorescent material D2 was used. The powder characteristics and the analysis values of Fluorescent material 12 are shown in Table 3.

Example 13

Fluorescent material 13 was prepared in the same manner as Example 3, by heat treating the fluorescent material after the phosphate compound was adhered to the fluorescent material, except that Fluorescent material D2 obtained in Example 12 was used. The powder characteristics and the analysis values of Fluorescent material 13 are shown in Table 3.

TABLE 3

| | Fluorescent material particles | Average particle diameter (μm) | Dm (μm) | Emission properties (450 nm) | | | Excitation spectrum relative intensity (%) | Phosphate analysis value (mass %) | Calcium analysis value (mass %) |
|---|---|---|---|---|---|---|---|---|---|
| | | | | x | y | ENG (%) | | | |
| Example 1 | Fluorescent material B | 10.8 | 18.9 | 0.148 | 0.422 | 100.0 | 89.8 | 2.6 | 0.62 |
| Example 2 | Fluorescent material C | 11.8 | 20.5 | 0.148 | 0.439 | 124.1 | 86.2 | 2.6 | 0.63 |
| Example 3 | Fluorescent material D | 12.8 | 20.1 | 0.150 | 0.446 | 133.5 | 81.4 | 2.6 | 0.64 |
| Example 4 | Fluorescent material E | 12.8 | 18.3 | 0.151 | 0.448 | 110.9 | 69.9 | 2.6 | 0.63 |
| Example 5 | Fluorescent material F | 12.4 | 17.1 | 0.150 | 0.446 | 106.6 | 61.3 | 2.6 | 0.63 |
| Example 6 | Fluorescent material A | 11.2 | 18.9 | 0.150 | 0.409 | 67.6 | 95.2 | 2.9 | 0.74 |
| Example 7 | Fluorescent material D | 13.4 | 19.7 | 0.149 | 0.451 | 126.3 | 81.2 | 1.5 | 0.36 |
| Example 8 | Fluorescent material D | 12.8 | 21.0 | 0.148 | 0.449 | 139.6 | 82.5 | 4.1 | 1.10 |
| Example 9 | Fluorescent material D | 12.2 | 20.9 | 0.148 | 0.448 | 139.0 | 83.1 | 5.6 | 1.40 |
| Example 10 | Fluorescent material D | 13.6 | 20.2 | 0.148 | 0.448 | 137.7 | 83.0 | 2.9 | 0.76 |
| Example 11 | Fluorescent material D1 | 14.4 | 22.9 | 0.150 | 0.460 | 167.6 | 82.9 | 2.6 | 0.65 |
| Example 12 | Fluorescent material D2 | 15.0 | 25.4 | 0.151 | 0.461 | 162.9 | 82.0 | 2.5 | 0.62 |
| Example 13 | Fluorescent material D2 | 14.8 | 25.7 | 0.152 | 0.460 | 161.7 | 82.2 | 2.5 | 0.62 |

Comparative Example 1

Fluorescent material C1 was prepared in the same manner as Example 1 except that Fluorescent material D was used as fluorescent material particles, and that no heat treatment was carried out. The powder characteristics and the analysis values of Fluorescent material C1 are shown in Table 4.

Comparative Example 2

Fluorescent material C2 was prepared in the same manner as Example 1 except that Fluorescent material D was used as fluorescent material particles, and that heat treatment was carried out at a temperature of 400° C. The powder characteristics and the analysis values of Fluorescent material C2 are shown in Table 4.

Comparative Example 3

Fluorescent material C3 was prepared in the same manner as Example 1 except that Fluorescent material D was used as fluorescent material particles, and that heat treatment temperature was carried out at 800° C. The powder characteristics and the analysis values of Fluorescent material C3 are shown in Table 4.

TABLE 4

| | Heat treating | Average particle diameter (μm) | Dm (μm) | Emission properties (450 nm) | | | Excitation spectrum relative intensity (%) | Phosphate analysis value (mass %) | Calcium analysis value (mass %) |
|---|---|---|---|---|---|---|---|---|---|
| | | | | x | y | ENG (%) | | | |
| Comparative Example 1 | — | 10.0 | 20.3 | 0.149 | 0.459 | 164.4 | 85.4 | 2.6 | 0.64 |
| Comparative Example 2 | 400° C. | 11.0 | 19.6 | 0.149 | 0.451 | 148.0 | 85.6 | 2.6 | 0.64 |
| Comparative Example 3 | 800° C. | 14.2 | 22.1 | 0.150 | 0.440 | 36.4 | 40.1 | 2.6 | 0.64 |

Differential Scanning Calorimetry (DSC) of Fluorescent Material

Figure 9:
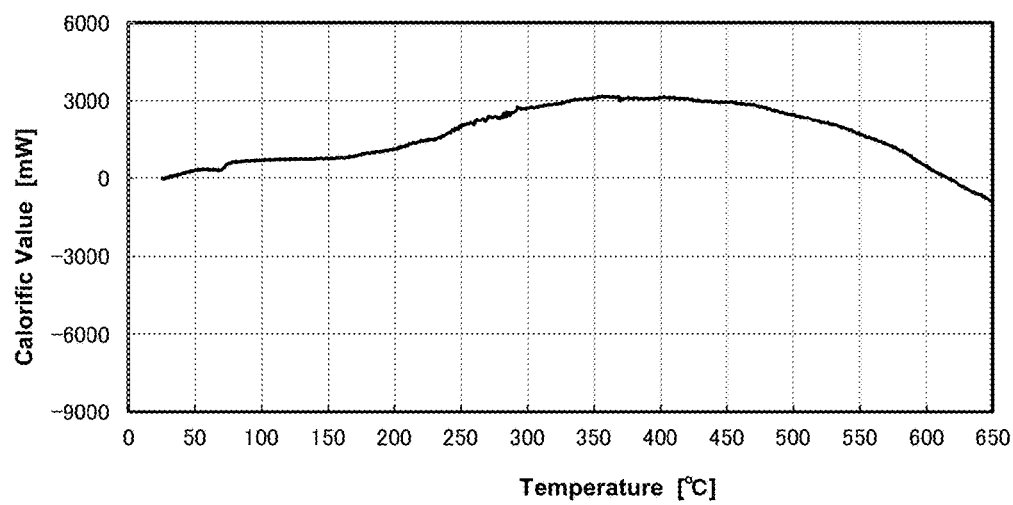
FIG. 9 is a graph showing an example of a differential scanning calorimetry (DSC) curve showing the calorific value versus the temperature of a fluorescent material after heat treatment.
Figure 10:
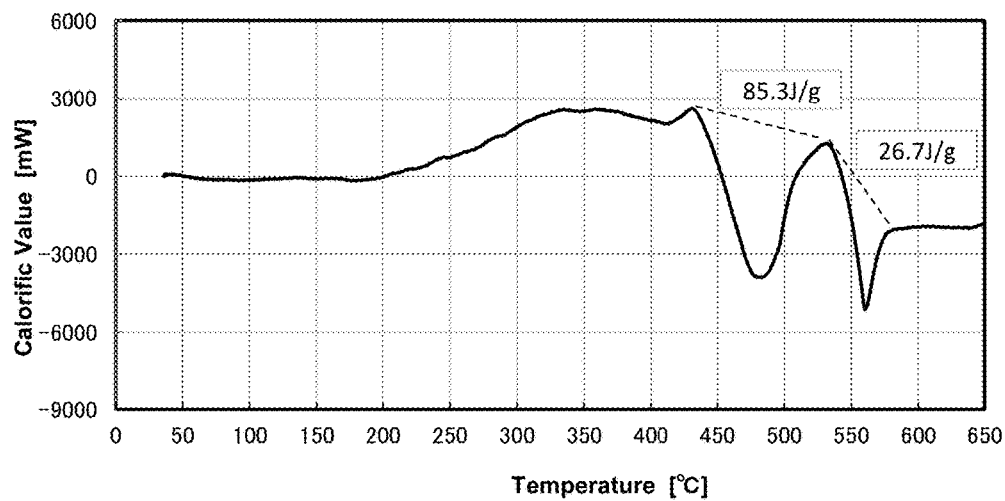
FIG. 10 is an example of a DSC curve showing the calorific value versus the temperature of non-heat treated fluorescent material particles to which a phosphate compound is adhered.

Fluorescent material 9, which was heat treated, and Fluorescent material particles 9p, which was not yet heat treated, both obtained in Example 9, were subjected to DSC under the following conditions. The measurement results are shown in FIGS. 9 and 10. FIG. 9 shows a DSC curve of Fluorescent material 9, and FIG. 10 shows a DSC curve of Fluorescent material particles 9p.

DSC Conditions

Instrument: EXSTAR6000 (manufactured by Hitachi High-Tech Science Corporation)
Sample amount: 18.5 mg
Measurement temperature range: 25° C. to 650° C.
Rate of temperature increase: 10° C./min
Atmosphere: atmospheric air
Flow rate: 50 ml/min In the DSC curve in FIG. 9, no clear endothermic trough is observed for Fluorescent material 9, which was heat treated, whereas two endothermic troughs are observed in FIG. 10 for Fluorescent material particles 9p, which was not yet heat treated. From the DSC curves, the endotherm for Fluorescent material 9 at a temperature range of 25° C. to 650° C. was calculated to be 0 J/g, whereas the endotherm for Fluorescent material particles 9p was calculated to be 112 J/g.

The fluorescent materials of Examples 1 to 8, and 10 to 13 have the same endotherm at 25° C. to 650° C. as that of Fluorescent material 9.

Production of the Light Emitting Device

Example L1

Light emitting device 1 was prepared in the following steps: Fluorescent material 1 obtained in Example 1 was added in the percentage shown in Table 5 to a silicone resin so that light emitted by the light emitting device has chromaticity coordinates around x=0.150, y=0.175. The mixture was then mixed and dispersed, and further defoamed to yield a fluorescent material-containing resin composition. The resultant fluorescent material-containing resin composition was then poured onto a light emitting element in an LED package (peak emission wavelength of the light-emitting element: 450 nm) to fill the recess, followed by heating at 150° C. for 4 hours to cure the resin composition. The fluorescent material contents are percentages on mass basis taking the silicone resin as 100% by mass.

Emission properties of Light emitting device 1 were measured. Light emitting device 1 was placed in a constant-temperature bath set at a temperature of 60° C. and a humidity of 90%, and lighted with an electric current of 150 mA. The reliability test of Light emitting device 1 was carried out. The reliability of Light emitting device 1 was evaluated by comparing the color tones before and after lighting the device in the constant-temperature bath. Specifically, the evaluation was made by the amount of shift (expressed as Δy) in color tone after lighting 1000 hours in the constant-temperature bath from the color tone before the lighting in the constant-temperature bath. The amount of shift in color tone was evaluated by value y in the x-y chromaticity coordinates. The evaluation results are shown in Table 5.

Δy=(value y after 1000 hours)−(value y before lighting)

Examples L2 to L11

Light emitting devices 2 to 11 were prepared in the same manner as Example L1 except that Fluorescent materials 2 to 11 were respectively used as fluorescent materials as shown in Table 5 in place of Fluorescent material 1, and were then evaluated in the same manner. The evaluation results are shown in Table 5.

Comparative Examples L1 to L5

Light emitting devices were prepared in the same manner as Example L1 except that Fluorescent materials C1 and C2, and Fluorescent materials D to F were respectively used as fluorescent materials in place of Fluorescent material 1 as shown in Table 6, and were evaluated in the same manner. The evaluation results are shown in Table 6 together with the results of Example L3.

TABLE 5

| Fluorescent material | | Emission properties | | | |
|---|---|---|---|---|---|
| | content (mass %) | Emission efficiency (lm/W) | x | y | Δy 1000 hr |
| Example L1 | Fluorescent material 1 | 72 | 39.1 | 0.145 | 0.179 | −0.002 |
| Example L2 | Fluorescent material 2 | 46 | 43.3 | 0.146 | 0.180 | −0.002 |
| Example L3 | Fluorescent material 3 | 35 | 44.3 | 0.147 | 0.177 | 0.000 |
| Example L4 | Fluorescent material 4 | 35 | 41.1 | 0.147 | 0.177 | 0.002 |
| Example L5 | Fluorescent material 5 | 38 | 39.7 | 0.147 | 0.173 | 0.003 |
| Example L6 | Fluorescent material 6 | 150 | 28.8 | 0.145 | 0.170 | −0.001 |
| Example L7 | Fluorescent material 7 | 38 | 42.5 | 0.147 | 0.173 | 0.004 |
| Example L8 | Fluorescent material 8 | 33 | 45.3 | 0.147 | 0.172 | −0.002 |
| Example L9 | Fluorescent material 9 | 33 | 45.2 | 0.147 | 0.171 | −0.001 |
| Example L10 | Fluorescent material 10 | 35 | 45.4 | 0.148 | 0.173 | −0.001 |
| Example L11 | Fluorescent material 11 | 32 | 45.6 | 0.148 | 0.166 | −0.001 |

TABLE 6

| Fluorescent material | | Emission properties | | | |
|---|---|---|---|---|---|
| | content (mass %) | Emission efficiency (lm/W) | x | y | Δy 1000 hr |
| Example L3 | Fluorescent material 3 | 35 | 44.3 | 0.147 | 0.177 | 0.000 |
| Comparative Example L1 | Fluorescent material C1 | 30 | 44.1 | 0.148 | 0.171 | −0.004 |
| Comparative Example L2 | Fluorescent material C2 | 33 | 45.8 | 0.148 | 0.179 | −0.003 |
| Comparative Example L3 | Fluorescent material D | 30 | 45.5 | 0.147 | 0.174 | −0.012 |
| Comparative Example L4 | Fluorescent material E | 27 | 45.0 | 0.148 | 0.170 | −0.015 |
| Comparative Example L5 | Fluorescent material F | 36 | 45.0 | 0.148 | 0.178 | −0.016 |

Examples 21 to 29

Light emitting devices 21 to 29 were each prepared in the following steps: Fluorescent material 3 obtained in Example 3 was added in the percentage relative to a silicone resin as shown in Table 7. To this, 0.4% by mass of a silica filler relative to the resin was further added, and then mixed and dispersed, and further defoamed to prepare a fluorescent material-containing resin composition. The fluorescent material-containing resin composition was then poured onto a light emitting element in an LED package (peak emission wavelength of the light-emitting element: 450 nm) to fill the recess, followed by heating at 150° C. for 4 hours to cure the resin composition.

Figure 8:
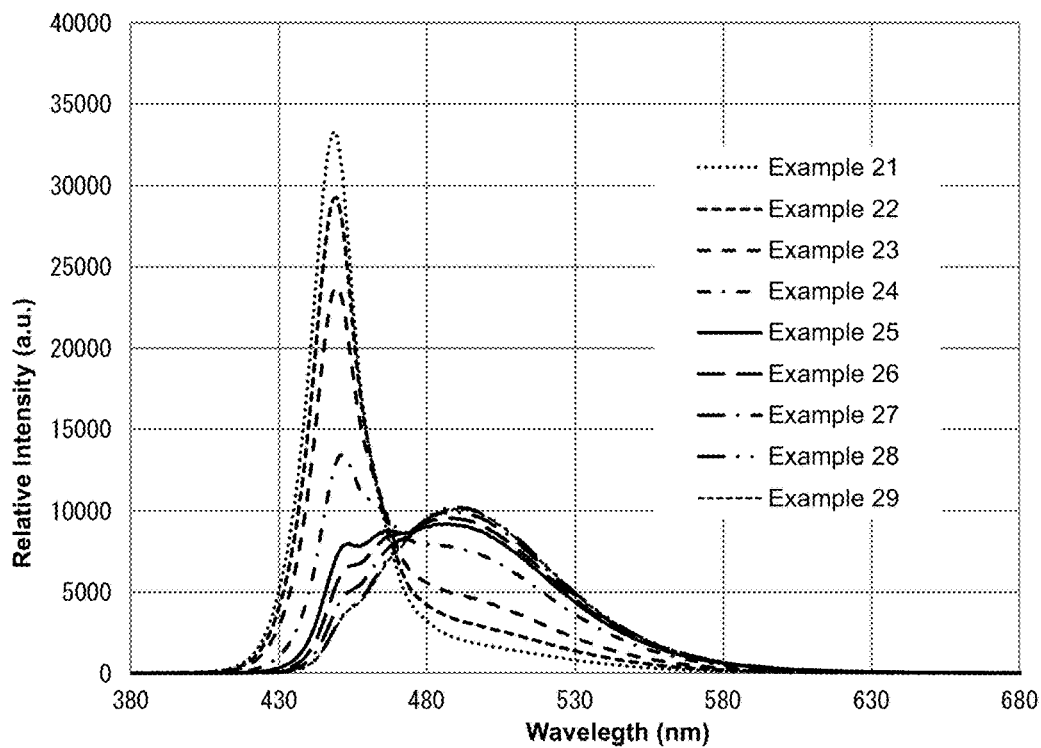
FIG. 8 is a graph showing exemplary emission spectra of relative intensity versus wavelength for light emitting devices.

For each of the resultant light emitting devices, emission properties were measured. The emission intensity of the light-emitting element at a peak emission wavelength (the light-emitting element's emission intensity: A) relative to the emission intensity at a peak emission wavelength of each fluorescent material (each fluorescent material's emission intensity: B), or the ratio (A/B) was calculated. The results are shown in Table 7. The emission spectra of Light emitting devices 21 to 29 are shown in FIG. 8.

TABLE 7

| | Fluorescent material content (mass %) | Emission properties | | | Light-emitting element's emission intensity: A | Fluorescent material's emission intensity: B | A/B |
|---|---|---|---|---|---|---|---|
| | | Emission efficiency (lm/W) | x | y | | | |
| Example 21 | 2 | 30.4 | 0.154 | 0.051 | 33201 | 2094 | 15.9 |
| Example 22 | 5 | 41.8 | 0.152 | 0.074 | 29093 | 3265 | 8.9 |
| Example 23 | 10 | 58.2 | 0.151 | 0.111 | 23427 | 4810 | 4.9 |
| Example 24 | 40 | 86.3 | 0.148 | 0.203 | 12294 | 7652 | 1.6 |
| Example 25 | 70 | 99.8 | 0.146 | 0.278 | 6547 | 9114 | 0.7 |
| Example 26 | 100 | 103.7 | 0.146 | 0.304 | 4904 | 9509 | 0.5 |
| Example 27 | 130 | 108.4 | 0.145 | 0.334 | 3489 | 9912 | 0.4 |
| Example 28 | 160 | 111.3 | 0.146 | 0.358 | 2549 | 10237 | 0.2 |
| Example 29 | 190 | 110.7 | 0.146 | 0.361 | 2468 | 10147 | 0.2 |

Eu Amount of Fluorescent Material Composition and Powder Characteristics

Tables 2, 3 and 4 show that Fluorescent materials A to F and Fluorescent materials 1 to 6 (i.e., Examples 1 to 6) have particularly high emission efficiency when value x in formula (1) is in the range of 0.05≤x≤0.4.

LED Reliability

As for the LED reliability against heat and humidity of Comparative Examples L3 to L5, Table 6 shows that Δy is greater as the amount of Eu increases. Thus, the fluorescent material degrades more. As for the LED reliability against heat and humidity of Examples L1 to L6, Tables 5 and 6 show that Examples L1 to L6 have small Lys, indicating that these fluorescent materials degrade less.

As stated above, when the Eu amount in the fluorescent material composition is 0.2 to 1.6, or when x in formula (1) is $0.05 \le x \le 0.4$, the reliability of the fluorescent materials known in the art is poor although their emission efficiency is high. Thus, it was difficult to achieve both efficiency and reliability. However, performing the phosphate compound treatment and the heat treatment according to the present embodiment allows the fluorescent material to provide high LED reliability even in the range of $0.05 \le x \le 0.4$ where the emission efficiency is high, so that both high emission efficiency and LED reliability are achieved.

Heat Treatment Temperature

Figure 3:
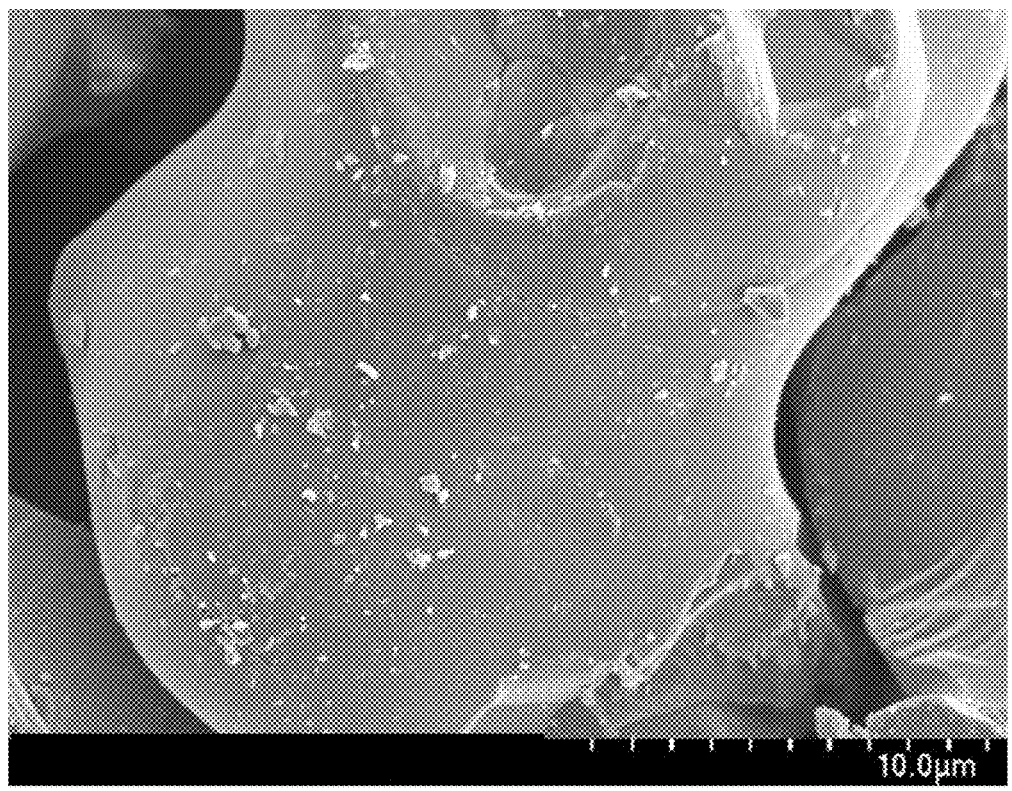
FIG. 3 is a scanning electron microscope (SEM) image of fluorescent material particles.
Figure 4:
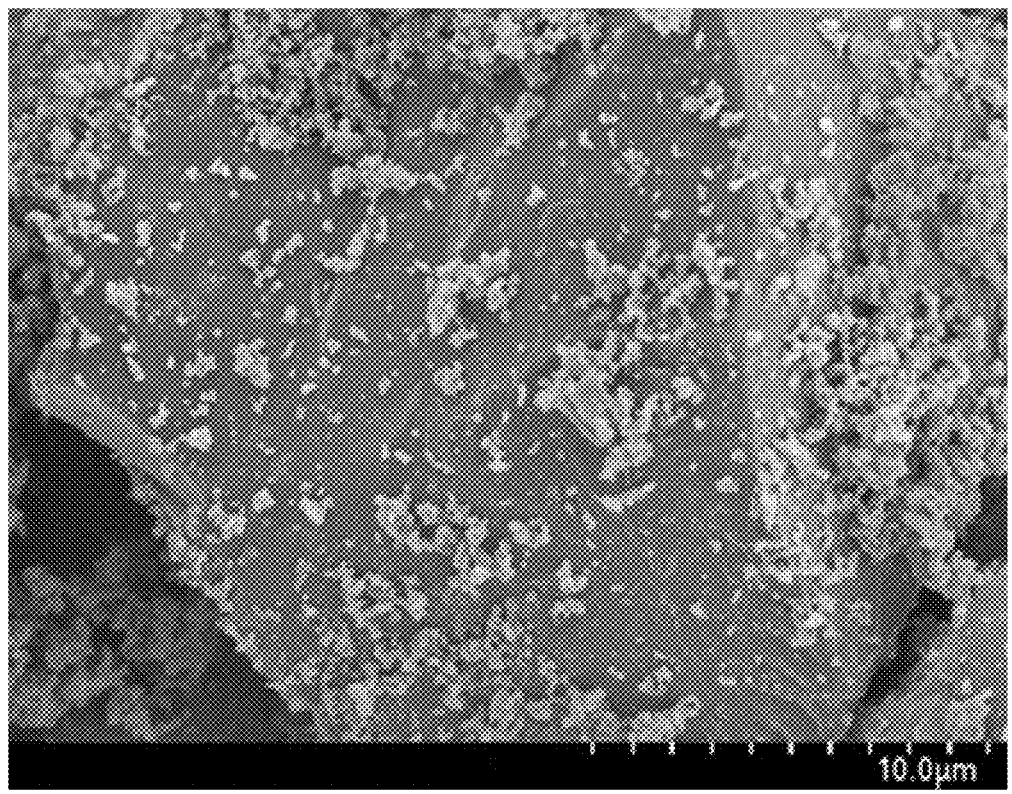
FIG. 4 is an SEM image of fluorescent material particles to which a phosphate compound is adhered, but which is not yet heat treated.
Figure 5:
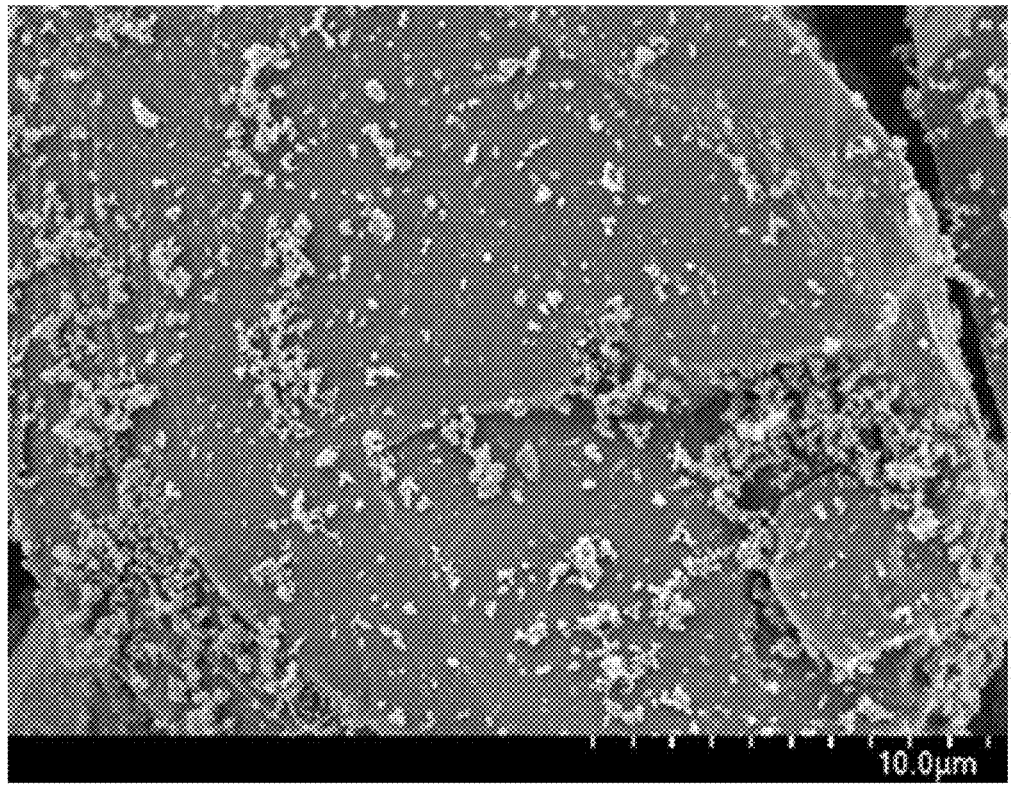
FIG. 5 is an SEM image of fluorescent material particles that have been heat treated at 400° C.
Figure 6:
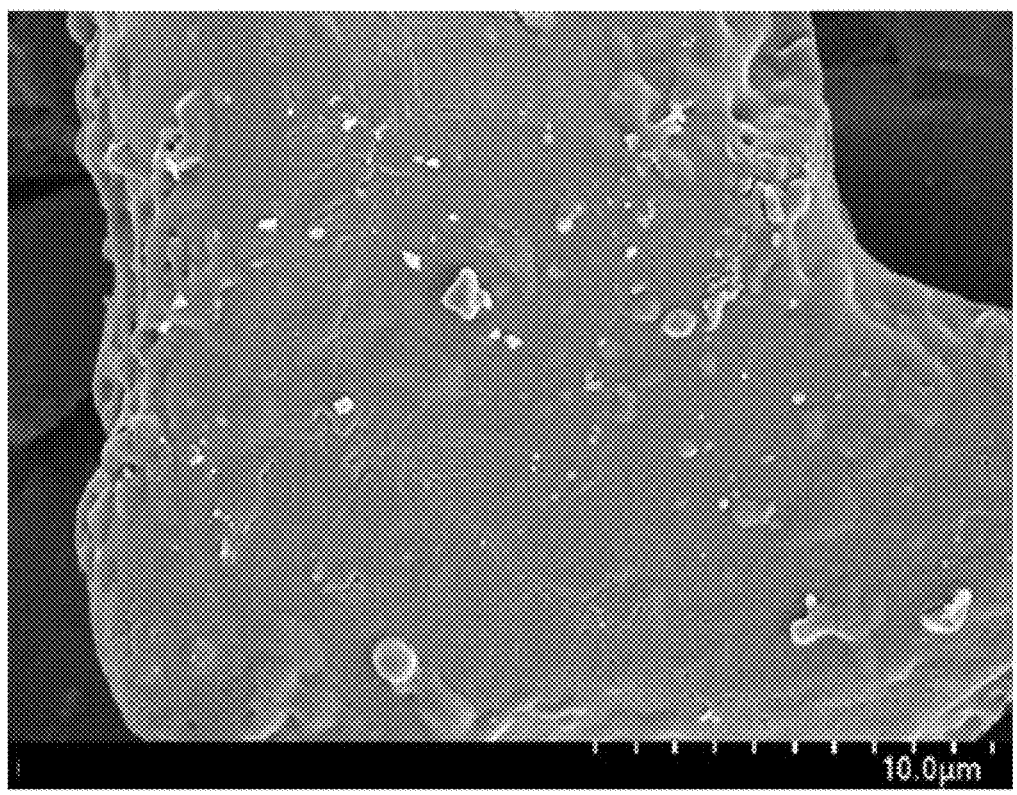
FIG. 6 is an SEM image of fluorescent material particles that have been heat treated at 600° C.

FIG. 3 shows an SEM image of Fluorescent material D, FIG. 4 shows an SEM image of Fluorescent material C1, which was not heat treated, FIG. 5 shows an SEM image of Fluorescent material C2, which was heat treated at 400° C., and FIG. 6 shows an SEM image of Fluorescent material 3, which was heat treated at 600° C.

The SEM images show that after adhesion treatment, the phosphate compound is adhered to the surfaces of the fluorescent material particles in the form of microparticles or a film. After heat treatment at 400° C., at least a part of the phosphate compound is adhered in the form of microparticles, whereas after heat treatment at 600° C., the phosphate compound is melted and adhered in the form of a film to the surfaces of the fluorescent material particles.

In the light emitting devices where Fluorescent materials C1 or C2 were used, the amount of shift Δy is larger and the LED reliability is lower compared to the light emitting device where Fluorescent material 3 was used. This indicates that heat treatment at a temperature not lower than 500° C. further improves LED reliability.

Figure 7:
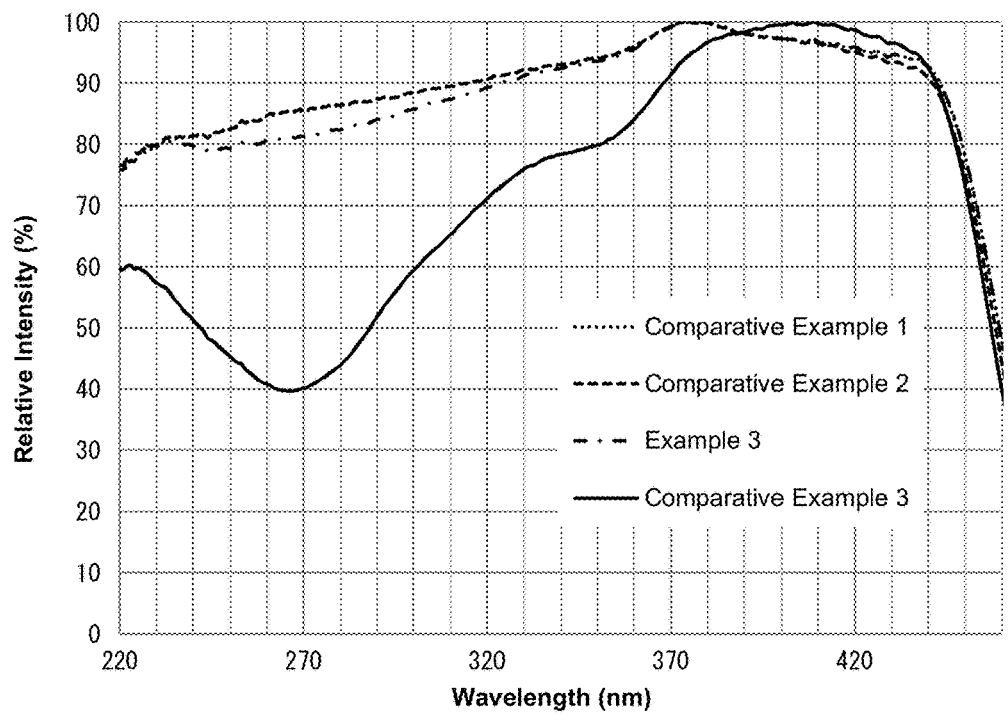
FIG. 7 is a graph showing effects of heat treatment temperature on excitation spectra.

FIG. 7 shows the excitation spectra of Fluorescent material C1, which was not heat treated, Fluorescent material C2, which was heat treated at 400° C., Fluorescent material C3, which was heat treated at 800° C., and Fluorescent material 3, which was heat treated at 600° C. Fluorescent material C3, which was heat treated at 800° C., has a relative intensity at 270 nm of 40%, when the peak intensity of the excitation spectrum is taken as 100%, showing that the relative intensity has been decreased. This is presumably because the heat treatment at an exceedingly high temperature degraded the fluorescent material.

Amount of Adhesion of the Phosphate Compound

According to Examples 3, 7, 8, and 9 in Table 3, when the sum of the phosphoric acid analysis value and the Ca analysis value is in the range of 3.24 to 7.0, the shift Δy is small, and the LED reliability is higher.

Atmosphere During Heat Treatment

Examples 3 and 10 demonstrate that heat treatment in the atmospheric air and a nitrogen atmosphere provides higher emission efficiency and LED reliability.

Purification Treatment of Fluorescent Material Particles

Examples 10 and 11 demonstrate that the washing treatment, for example, in an acidic solution, and the phosphate compound treatment and the heat treatment of a fluorescent material having a small analysis value of Sr are highly efficient. The analysis value of Sr is 250 ppm in Examples 10, 35 ppm in Example 11, and 14 ppm in Example 12. Reducing the elution of the fluorescent material components from the surfaces of the fluorescent material particles reduces the elution of the fluorescent material components from the fluorescent material particles during the phosphate compound adhesion treatment. This is considered to allow the phosphate compound to adhere to the fluorescent material more efficiently.

According to Examples 12 and 13, the fluorescent material particles can be sufficiently purified by washing without drying, so that drying is not essential.

Figure 11:
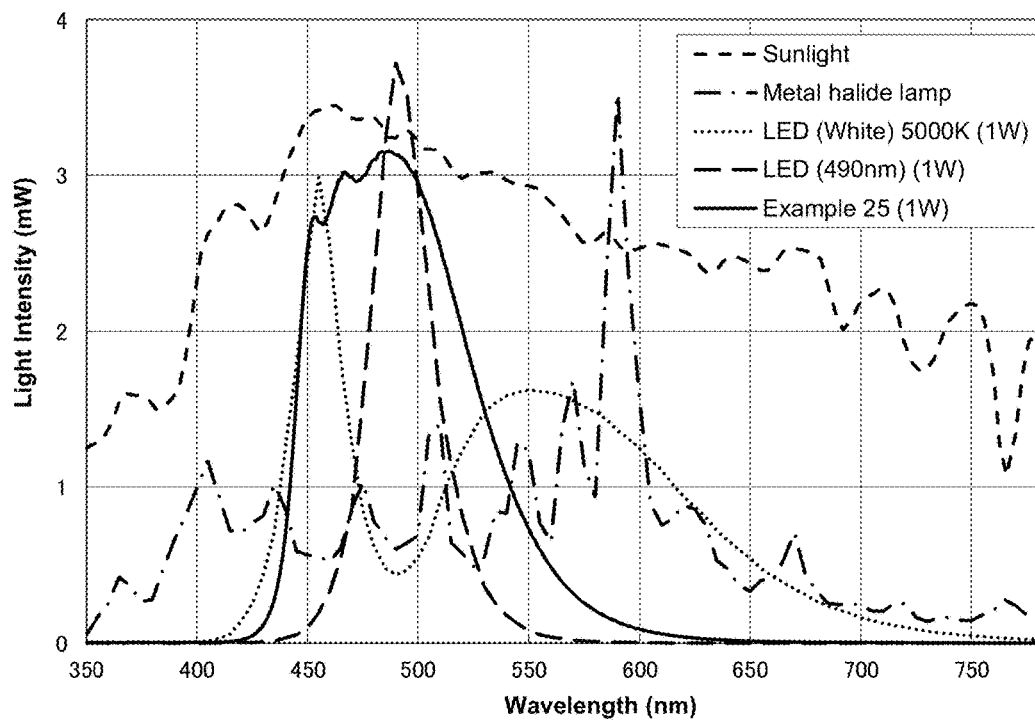
FIG. 11 is a graph showing exemplary spectra of light intensity versus wavelength for light sources.

FIG. 11 shows a spectrum of light intensity plotted on vertical axis against wavelength on horizontal axis for each light source. FIG. 11 shows spectra taken using, as light sources, sunlight, a metal halide lamp with an output of 1 W, a white light emitting device with an output of 1 W (correlated color temperature: 5000 K), a semiconductor light-emitting element with an output of 1 W and a peak light emission at 490 nm, and a light emitting device according to the present disclosure with an output of 1 W. According to the spectra, sunlight shows about a uniform degree of intensity across a wide range of wavelength, and a metal halide lamp for use as a fish collecting lamp (1 W) having a peak light emission at around 590 nm also shows about a uniform degree of intensity across a wide range of wavelength. In contrast, the white light emitting device, the semiconductor light-emitting element, and the light emitting device according to the present embodiment each show a spectrum having a peak light emission at a specific wavelength.

Figure 12:
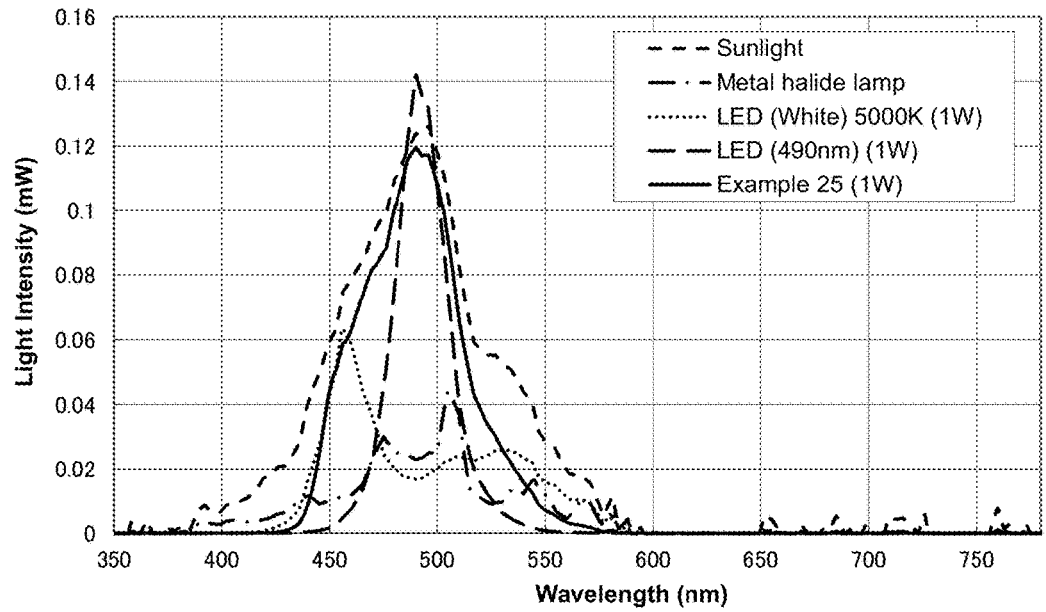
FIG. 12 is a graph showing exemplary spectra of light intensity versus wavelength for light sources in seawater.

FIG. 12 shows spectra of various kinds of light from various light sources. Each light has been transmitted through the seawater to a depth of 50 m. Sunlight shows a spectrum having a strong light intensity across a comparatively wide wavelength with a peak at around 490 nm. The metal halide lamp and the white light emitting device each show a lower light intensity. Although the semiconductor light-emitting element shows a high light intensity, its spectrum half bandwidth is about the half of that of sunlight. In contrast, the light emitting device according to the present embodiment shows a spectrum about the same as that of sunlight. The visibility curve of undersea life (e.g., squid) is a spectrum having a comparatively broad half bandwidth and a peak at around 490 nm. Applying a light emitting device according to the present embodiment, for example, to a fish collecting lamp may have a high fish collecting effect with a high energy efficiency compared to a conventional metal halide lamp and a semiconductor light-emitting element.

The fluorescent material, the production method, and the light emitting device according to the present embodiment can be used in a wide range of fields including general purpose lighting, in-vehicle lighting, displays, fish collecting lamps, lighting for ornamental purposes, warning lighting, security lighting, indicating lighting, and backlights for liquid crystal displays.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

All publications, patent applications, and technical standards mentioned in this specification are herein incorporated by reference to the same extent as if each individual publication, patent application, or technical standard was specifically and individually indicated to be incorporated by reference.

What is claimed is:

1. A method for producing a fluorescent material comprising:
   preparing fluorescent material particles that contain an alkaline earth metal aluminate having a composition represented by formula (1):

$$(Sr_{1-x},Eu_x)_4Al_{14}O_{25} \qquad (1)$$

wherein x satisfies 0.05≤x≤0.4, and a part of Sr may be substituted by at least one element selected from the group consisting of Mg, Ca, Ba, and Zn;

causing the prepared fluorescent material particles to come into contact with a liquid medium containing water;

removing at least a portion of the contacted liquid medium to obtain purified fluorescent material particles;

causing a phosphate compound to adhere to surfaces of the purified fluorescent material particles to obtain fluorescent material particles to which the phosphate compound is adhered; and heat treating the fluorescent material particles to which the phosphate compound is adhered at 500° C. to 700° C.

2. The method according to claim 1, wherein the liquid medium containing water comprises an acidic compound.

3. The method according to claim 1, wherein an amount of alkaline earth metal aluminate eluted from the purified fluorescent material particles into pure water at 25° C. is 50 ppm or less.

4. The method according to claim 1, wherein the phosphate compound is at least one phosphate selected from the group consisting of magnesium phosphate, calcium phosphate, strontium phosphate, barium phosphate, yttrium phosphate, and lanthanoid phosphate.

5. The method according to claim 1, wherein at least one cation selected from the group consisting of calcium ion, magnesium ion, strontium ion, barium ion, yttrium ion, and lanthanoid ion is caused to come into contact with a phosphate ion in the liquid medium containing the purified fluorescent material particles to allow the phosphate compound to adhere to the surfaces of the purified fluorescent material particles.

6. A fluorescent material comprising:
fluorescent material particles containing an alkaline earth metal aluminate, and
a phosphate compound arranged on surfaces of the fluorescent material particles, wherein
the fluorescent material has an endotherm, determined by a differential scanning calorimetry, of 50 J/g or less at 25° C. to 650° C.

7. The fluorescent material according to claim 6, wherein the alkaline earth metal aluminate has a composition represented by formula (1):

$$(Sr_{1-x}Eu_x)_4Al_{14}O_{25} \qquad (1)$$

wherein x satisfies 0.05≤x≤0.4, and a part of Sr may be substituted by at least one element selected from the group consisting of Mg, Ca, Ba, and Zn.

8. The fluorescent material according to claim 7, wherein x satisfies 0.1≤x≤0.3.

9. The fluorescent material according to claim 6, wherein a relative intensity at 270 nm is 60% or more in an excitation spectrum when a maximum peak intensity of the excitation spectrum is taken as 100%.

10. A light emitting device comprising:
a fluorescent material according to claim 6, and
a light-emitting element having a peak emission wavelength in a wavelength range of 380 nm to 470 nm, wherein
a ratio of an emission intensity at a peak emission wavelength of the light-emitting element relative to an emission intensity at a peak emission wavelength of the fluorescent material is 10 or less in an emission spectrum.

11. The light emitting device according to claim 10, wherein the ratio is 1 or less.

* * * * *